United States Patent
Lee et al.

(10) Patent No.: US 8,716,766 B2
(45) Date of Patent: May 6, 2014

(54) GRAPHENE SEMICONDUCTOR DEVICE, MANUFACTURING METHOD THEREOF, ORGANIC LIGHT EMITTING DISPLAY, AND MEMORY INCLUDING GRAPHENE SEMICONDUCTOR DEVICE

(75) Inventors: Chang-seung Lee, Yongin-si (KR); Young Bae Kim, Seoul (KR); Young Jun Yun, Gyeonggi-do (KR); Yong Sung Kim, Gyeonggi-do (KR); David Seo, Gyeonggi-do (KR); Joo-ho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/523,554

(22) Filed: Jun. 14, 2012

(65) Prior Publication Data

US 2013/0256629 A1    Oct. 3, 2013

(30) Foreign Application Priority Data

Apr. 3, 2012    (KR) .................... 10-2012-0034494

(51) Int. Cl.
*H01L 29/76*      (2006.01)

(52) U.S. Cl.
USPC   257/288; 438/455; 257/E27.05; 257/E21.053

(58) Field of Classification Search
USPC .............. 438/455; 257/288, E27.05, E21.053
See application file for complete search history.

(56) References Cited

U.S. PATENT DOCUMENTS

| 8,013,363 | B2 | 9/2011 | Bertin et al. |
| 8,023,310 | B2 | 9/2011 | Fu et al. |
| 2010/0176366 | A1 | 7/2010 | Fu et al. |
| 2010/0320445 | A1 * | 12/2010 | Ogihara et al. ................ 257/26 |
| 2011/0068323 | A1 | 3/2011 | Chen et al. |
| 2011/0084252 | A1 | 4/2011 | Wu et al. |
| 2011/0101309 | A1 * | 5/2011 | Lin et al. ........................ 257/29 |
| 2011/0114919 | A1 | 5/2011 | Jenkins et al. |
| 2011/0170330 | A1 | 7/2011 | Oezyilmaz et al. |
| 2011/0175060 | A1 | 7/2011 | Okai et al. |
| 2011/0227044 | A1 | 9/2011 | Kawanaka et al. |
| 2013/0032794 | A1 * | 2/2013 | Lee et al. ........................ 257/43 |
| 2013/0161587 | A1 * | 6/2013 | Xianyu et al. ................... 257/29 |
| 2013/0171781 | A1 * | 7/2013 | Lee et al. ..................... 438/197 |

FOREIGN PATENT DOCUMENTS

| KR | 20110068838 A | 6/2011 |
| KR | 20110105408 A | 9/2011 |
| WO | WO-2010036210 A1 | 4/2010 |
| WO | WO-2010083067 A1 | 7/2010 |

* cited by examiner

*Primary Examiner* — Trung Q Dang
(74) *Attorney, Agent, or Firm* — Harness, Dickey & Pierce, P.L.C.

(57) ABSTRACT

Graphene semiconductor device, a method of manufacturing a graphene semiconductor device, an organic light emitting display and a memory, include forming a multilayered member including a sacrificial substrate, a sacrificial layer, and a semiconductor layer deposited in sequence, forming a transfer substrate on the semiconductor layer, forming a first laminate including the transfer substrate and the semiconductor layer by removing the sacrificial layer to separate the sacrificial substrate from the semiconductor layer, forming a second laminate by forming a graphene layer on a base substrate, combining the first laminate and the second laminate such that the semiconductor layer contacts the graphene layer, and removing the transfer substrate.

20 Claims, 20 Drawing Sheets

GRAPHENE SEMICONDUCTOR DEVICE, MANUFACTURING METHOD THEREOF, ORGANIC LIGHT EMITTING DISPLAY, AND MEMORY INCLUDING GRAPHENE SEMICONDUCTOR DEVICE

CROSS REFERENCE TO RELATED APPLICATIONS

This application claims priority under 35 U.S.C. §119 to Korean Patent Application No. 10-2012-0034494 filed in the Korean Intellectual Property Office on Apr. 3, 2012, the entire contents of which are incorporated herein by reference.

BACKGROUND

1. Field

Example embodiments relate to a graphene semiconductor device, a manufacturing method thereof, an organic light emitting display including a graphene semiconductor device, and a memory including a graphene semiconductor device.

2. Description of the Related Art

Graphene is a two-dimensional planar structure of carbon atoms that are arranged in a honeycomb. Because graphene is relatively thin, has desirable thermal and electric conductivity, and has relatively high physical and chemical stability, graphene may be applied to semiconductor devices.

A graphene layer may be deposited in various ways. Although a small-area graphene layer may be deposited by a stripping method using a graphite crystal, a large-area graphene layer may be deposited with the help of a catalyst layer, which may make the deposition process complicated.

However, it may be hard to grow a graphene layer on a semiconductor (e.g., silicon (Si) or GaAs semiconductor), and thus the graphene layer may have a limitation in its application to a semiconductor electronic device.

SUMMARY

Example embodiments provide a graphene semiconductor device and a manufacturing method thereof, an organic light emitting display, and a memory.

Example embodiments relate to a graphene semiconductor device, a manufacturing method thereof, an organic light emitting display including a graphene semiconductor device, and a memory including a graphene semiconductor device.

According to example embodiments, a method of manufacturing a graphene semiconductor device includes forming a multilayered member including a sacrificial substrate, a sacrificial layer, and a semiconductor layer deposited in sequence, forming a transfer substrate on the semiconductor layer, forming a first laminate including the transfer substrate and the semiconductor layer by removing the sacrificial layer to separate the sacrificial substrate from the semiconductor layer, forming a second laminate by forming a graphene layer on a base substrate, combining the first laminate and the second laminate such that the semiconductor layer may contact the graphene layer, and removing the transfer substrate.

The semiconductor layer may include at least one of Si, GaAs, InP, GaP, and InAs. The sacrificial layer may include at least one of $SiO_2$, SiN, $Al_2O_3$, $HfO_2$, $ZrO_2$, AlGaAs, and AlAs.

Forming the multilayered member may include depositing a conductor layer on the semiconductor layer, patterning the conductor layer to form a first electrode, and patterning the semiconductor layer to form a semiconductor member.

Combining the first laminate and the second laminate may include contacting the semiconductor member with the graphene layer, and the method may further include forming a second electrode on an exposed surface of the graphene layer.

Forming the second laminate may include forming a gate electrode on the base substrate, forming a gate insulating layer on the gate electrode and the base substrate, and forming the graphene layer on the gate insulating layer. Combining the first laminate and the second laminate may include aligning the gate electrode with the semiconductor member.

The method may further include forming a light emitting layer, and forming a third electrode on the light emitting layer, wherein the light emitting layer is on the second electrode when the semiconductor layer includes an N-type semiconductor, and the light emitting layer is on the first electrode when the semiconductor layer includes a P-type semiconductor.

The method may further include forming a resistive material layer and a third electrode on one of the first electrode and the second electrode. The resistive material layer may have a resistance that varies based on a voltage across ends of the resistive material layer.

The base substrate may include an insulator, and the gate electrode may contact the base substrate.

The base substrate may include a semiconductor. Forming the second laminate may further include forming a subsidiary insulating layer between the base substrate and the gate electrode.

According to example embodiments, a graphene semiconductor device includes a gate electrode on a substrate, a gate insulating layer on the gate electrode, a graphene member on the gate insulating layer, a semiconductor member joined with the graphene member, a first electrode on the semiconductor member, and a second electrode on the graphene member. The second electrode is spaced apart from the semiconductor member and the first electrode.

The semiconductor layer may include at least one of Si, GaAs, InP, GaP, and InAs.

The device may further include a light emitting layer on one of the first electrode and the second electrode, and a third electrode on the light emitting layer, wherein the light emitting layer is on the second electrode when the semiconductor layer includes an N-type semiconductor, and the light emitting layer is on the first electrode when the semiconductor layer includes a P-type semiconductor.

The device may further include a resistive material layer on one of the first electrode and the second electrode, and a third electrode on the resistive material layer, wherein the resistive material layer has a resistance that varies based on a voltage across ends of the resistive material layer.

The substrate may include an insulator, and the gate electrode may contact the substrate.

The device may further include, a subsidiary insulating layer between the base substrate and the gate electrode, and the substrate may include a semiconductor.

At least one of the first electrode and the second electrode is transparent or translucent.

According to example embodiments, an organic light emitting display includes a switching unit including a graphene semiconductor device. The switching unit has a first terminal, a second terminal, and a third terminal. The organic light emitting display further includes a scanning line connected to the first terminal of the switching unit, a data line connected to the second terminal of the switching unit, and a light emitting unit connected to the third terminal of the switching unit. The graphene semiconductor device includes a gate electrode on a substrate, a gate insulating layer on the gate electrode, a graphene member on the gate insulating layer, a semiconductor member joined with the graphene member, a first electrode on the semiconductor member, and a second electrode on the graphene member. The second electrode is spaced apart from the semiconductor member and the first electrode.

According to example embodiments, an organic light emitting display includes a switching unit including a graphene semiconductor device. The switching unit has a first terminal, a second terminal, and a third terminal. The organic light emitting display further includes a scanning line connected to the first terminal of the switching unit, a data line connected to the second terminal of the switching unit, a driving unit having a first terminal and a second terminal, and a light emitting unit connected to the second terminal of the driving unit. The first terminal of the driving unit is connected to the third terminal of the switching unit. The graphene semiconductor device includes a gate electrode on a substrate, a gate insulating layer on the gate electrode, a graphene member on the gate insulating layer, a semiconductor member joined with the graphene member, a first electrode on the semiconductor member, and a second electrode on the graphene member. The second electrode is spaced apart from the semiconductor member and the first electrode.

According to example embodiments, a memory includes a switching unit including a graphene semiconductor device. The switching unit has a first terminal, a second terminal, and a third terminal. The memory further includes a word line connected to the first terminal of the switching unit, a gate line connected to the second terminal of the switching unit, a resistive unit having a first terminal and a second terminal, and a bit line connected to the second terminal of the resistive unit. The first terminal of the resistive unit is connected to the third terminal of the switching unit. The graphene semiconductor device includes a gate electrode on a substrate, a gate insulating layer on the gate electrode, a graphene member on the gate insulating layer, a semiconductor member joined with the graphene member, a first electrode on the semiconductor member, and a second electrode on the graphene member. The second electrode is spaced apart from the semiconductor member and the first electrode.

BRIEF DESCRIPTION OF THE DRAWINGS

The foregoing and other features of example embodiments will be apparent from the more particular description of non-limiting embodiments, as illustrated in the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
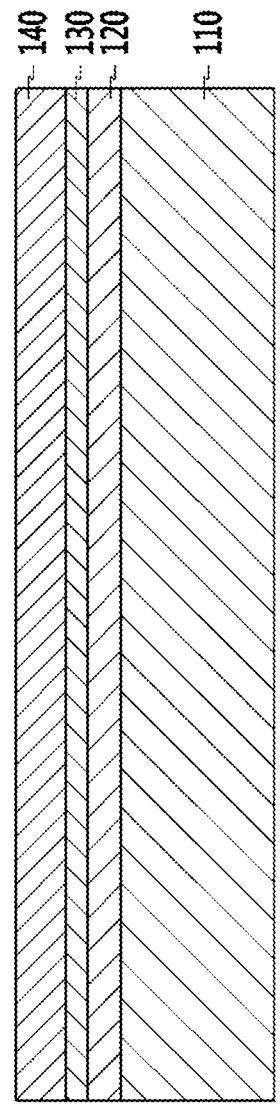
FIGS. 1 to 5 are schematic sectional views illustrating a method of manufacturing a graphene semiconductor device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments relate to a graphene semiconductor device, a manufacturing method thereof, an organic light emitting display including a graphene semiconductor device, and a memory including a graphene semiconductor device.

A method of manufacturing a graphene semiconductor device according to example embodiments is described in detail with reference to FIGS. 1 to 5.

FIGS. 1 to 5 are schematic sectional views illustrating a method of manufacturing a graphene semiconductor device according to example embodiments.

Referring to FIG. 1, in order to manufacture a graphene semiconductor device according to example embodiments, a multilayered member including a sacrificial substrate 110, a sacrificial layer 120, a semiconductor layer 130, and an optional layer 140 may be formed.

The sacrificial substrate 110 may include a semiconductor, but example embodiments are not limited thereto. The semiconductor layer 130 may include at least one of Si, GaAs, InP, GaP, and InAs, and may be single crystalline, amorphous, or polycrystalline. The sacrificial substrate 110 and the semiconductor layer 130 may include a same material.

The sacrificial layer 120 may include an insulator (e.g., an oxide or a nitride), and a material for the sacrificial layer 120 may be selected depending on a material included in the sacrificial substrate 110 or in the semiconductor layer 130.

For example, when the sacrificial substrate 110 and the semiconductor layer 130 include silicon, the sacrificial layer 120 may include at least one of a silicon dioxide ($SiO_2$), silicon nitrides ($SiN_x$), $Al_2O_3$, AlO, $HfO_2$, and $ZrO_2$. When the sacrificial substrate 110 and the semiconductor layer 130 include GaAs, the sacrificial layer 120 may include at least one of AlGaAs and AlAs that have improved etching selectivity from GaAs.

A triple-layered member including the sacrificial substrate 110, the sacrificial layer 120, and the semiconductor layer 130 may be formed in various ways. An example is silicon on insulator (SOI), where the sacrificial substrate 110 and the semiconductor layer 130 may include single crystalline silicon and the sacrificial layer 120 may include a silicon oxide. According to example embodiments, the semiconductor layer 130 may be deposited as an amorphous thin film or a polycrystalline thin film by using chemical or physical deposition (e.g., chemical vapor deposition (CVD) or sputtering).

The optional layer 140 may be disposed on the semiconductor layer 130 and may include a conductor. The optional layer 140 may be omitted.

Figure 2:
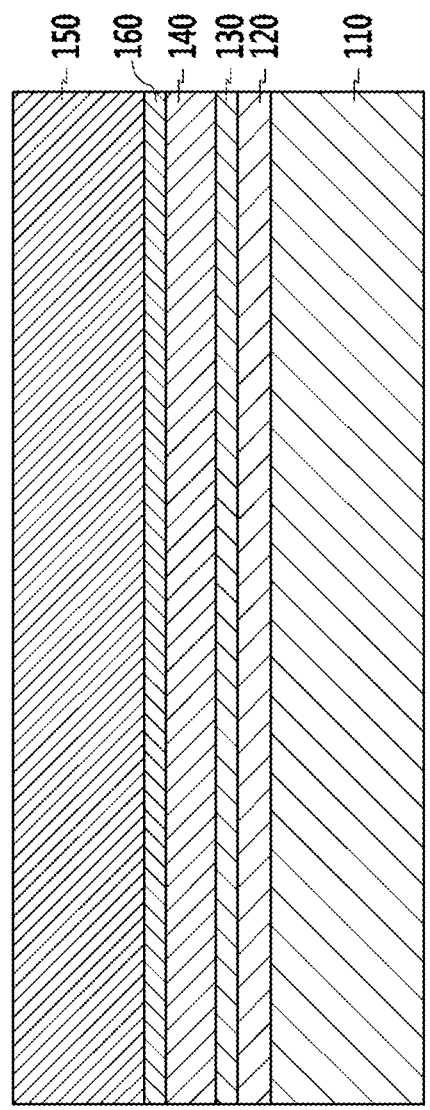

Referring to FIG. 2, a transfer substrate 150 may be stuck to the multilayered member with an adhesive layer 160. In example embodiments, the transfer substrate 150 may be located closer to the semiconductor layer 130 than the sacrificial substrate 110. That is, the transfer substrate 150 may be adhered to a surface of the optional layer 140, or, for the multilayered member without the optional layer 140, the transfer substrate 150 may be adhered to a surface of the semiconductor layer 130. The adhesive layer 160 may include an adhesive tape or another type of an adhesive.

Figure 3:
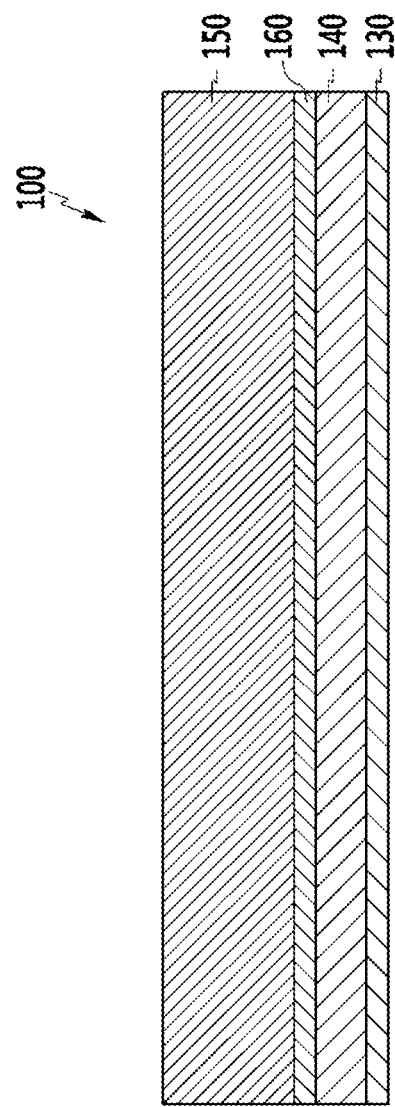

Referring to FIG. 3, the sacrificial layer 120 may be removed by a wet etch to remove the sacrificial substrate 110 and to expose a bottom surface of the semiconductor layer 130, thereby forming a laminate 100.

Figure 4:
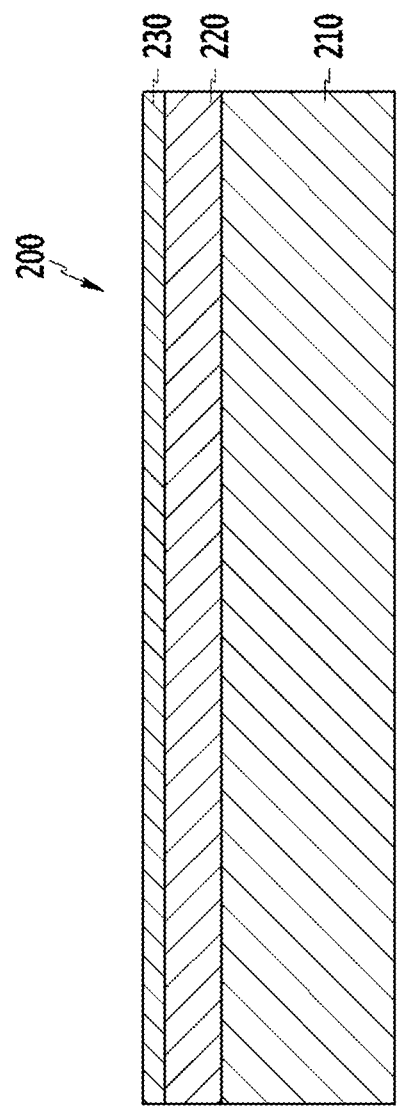

Referring to FIG. 4, an insulating layer 220 may be deposited on a base substrate 210, and a graphene layer 230 may be then deposited on the insulating layer 220 to form another laminate 200.

The base substrate 210 may be a semiconductor substrate that may include, for example, silicon. According to example embodiments, the base substrate 210 may be an insulating substrate that may include, for example, a glass.

The insulating layer 220 may include an oxide or a nitride of a semiconductor, and may be formed by depositing the oxide or the nitride on the base substrate 210 or by oxidizing or nitriding a surface of the base substrate 210. When the base substrate 210 includes an insulator, the insulating layer 220 may be omitted.

The graphene layer 230 may include multilayer graphene or single-layer graphene.

The deposition of the graphene layer 230 on the insulating layer 220 may be conducted in various ways including, for example, transfer printing or stripping. When using transfer printing, a sacrificial layer (not shown) and a catalyst layer (not shown) may be deposited in sequence on another sacrificial substrate (not shown), and the graphene layer 230 may be grown on the catalyst layer by a CVD process or a similar process. Another transfer substrate (not shown) may be adhered to the graphene layer 230 and the sacrificial layer may be then removed to separate the sacrificial substrate. Thereafter, the catalyst layer may be removed to expose a surface of the graphene layer 230, and the exposed surface of the graphene layer 230 may be attached to the insulating layer 220. The transfer substrate may be removed.

Figure 5:
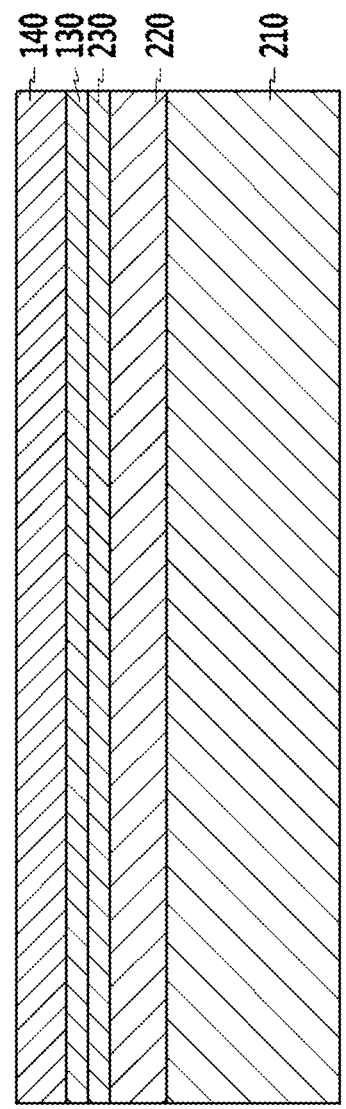

Referring to FIG. 5, the two laminates 100 and 200 may be attached to each other such that the exposed surface of the semiconductor layer 130 in the process shown in FIG. 3 contacts a surface of the graphene layer 230. The adhesive layer 160 may be removed to take out the transfer substrate 150, thereby completing the formation of a graphene semiconductor device.

According to example embodiments, the semiconductor layer 130 and the graphene layer 230 may be attached to each other in ease by using a transfer method.

The joint structure of the semiconductor layer 130 and the graphene layer 230 formed as described above may be used in various types of semiconductor devices.

For an example of such a semiconductor device, a graphene thin film diode according to example embodiments is described in detail with reference to FIGS. 6 and 7.

Figure 6:
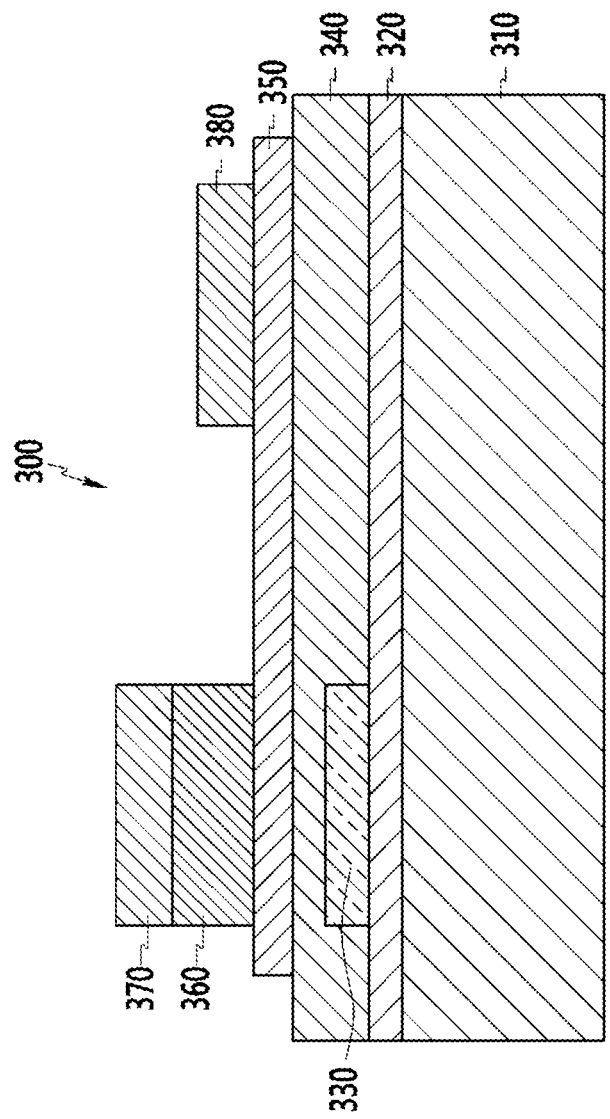
FIG. 6 is a schematic diagram of a graphene thin film diode according to example embodiments.
Figure 7:
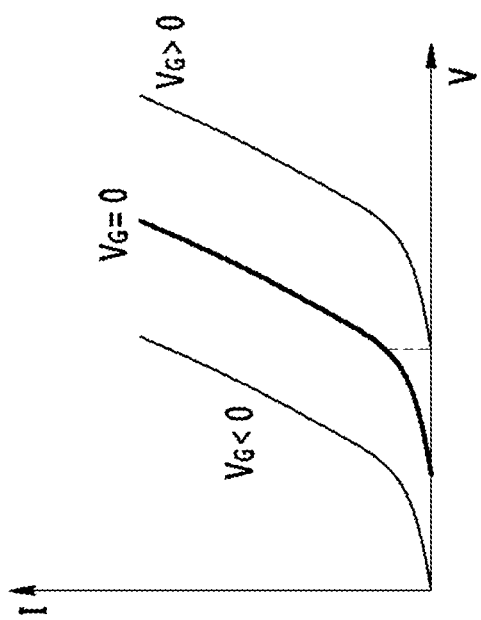
FIG. 7 is a graph showing a current-voltage characteristic of the graphene thin film diode shown in FIG. 6.

FIG. 6 is a schematic diagram of a graphene thin film diode according to example embodiments, and FIG. 7 is a graph showing a current-voltage characteristic of the graphene thin film diode shown in FIG. 6.

Referring to FIG. 6, a graphene thin film diode 300 according to example embodiments may include a base substrate 310, a subsidiary insulating layer 320, a gate electrode 330, a gate insulating layer 340, a graphene member 350, a semiconductor member 360, a first electrode 370, and a second electrode 380, which are disposed in sequence from bottom to top. The ordinal numbers (e.g., "first," "second," and so on) may merely denote the order of introduction in the description, and may not include a particular meaning. The ordinal numbers denoting the same element may be different between the claims and the description.

The base substrate 310 may include at least one of semiconductors including silicon (Si), GaAs, InP, GaP, and InAs. According to example embodiments, the base substrate 210 may include an insulator.

The subsidiary insulating layer 320 may be disposed on the base substrate 310, and may include an oxide or a nitride of a semiconductor (e.g., $SiO_2$, $SiN_x$, AlO, $HfO_2$, $ZrO_2$, or combinations thereof). When the base substrate 310 includes an insulator, the subsidiary insulating layer 320 may be omitted.

The gate electrode 330 may be disposed on the subsidiary insulating layer 320, and may include a conductive mater (e.g., a metal). The gate insulating layer 340 may be disposed on the subsidiary insulating layer 320 and the gate electrode 330, and the gate insulating layer 340 may include an oxide or a nitride of a semiconductor (e.g., $SiO_2$, $SiN_x$, AlO, $HfO_2$, $ZrO_2$, or combinations thereof).

The gate electrode 330 and the gate insulating layer 340 may be omitted. The graphene member 350 may be disposed on the gate insulating layer 340, and may include multilayer graphene or single-layer graphene.

The semiconductor member 360 may be disposed on the graphene member 350, and may be aligned roughly with the gate electrode 330. The semiconductor member 360 may include a P-type or N-type semiconductor, and may include at least one of Si, GaAs, InP, GaP, and InAs.

The first electrode 370 may be disposed on the semiconductor member 360, and the second electrode 380 may be disposed on the graphene member 350 and spaced apart from the first electrode 370 and the semiconductor member 360. When the semiconductor member 360 includes an N-type semiconductor, the first electrode 370 may play the role of an anode, and the second electrode 380 may play the role of a cathode. On the contrary, when the semiconductor member 360 includes a P-type semiconductor, the second electrode 380 may serve as an anode, and the first electrode 370 may serve as a cathode.

The graphene thin film diode 300 according to example embodiments may include the gate electrode 330 in addition to a pair of electrodes (i.e., the first electrode 370 and the second electrode 380) unlike a usual diode. The gate electrode 330 may be used for varying the current-voltage characteristic of the graphene thin film diode 300.

Referring to FIG. 7, the current-voltage (1-V) curve of the graphene thin film diode 300 may be varied depending on the magnitude of a gate voltage $V_G$ applied to the gate electrode 330.

For example, a higher gate voltage $V_G$ may cause a higher threshold voltage of the graphene thin film diode 300. The threshold voltage for a positive gate voltage $V_G$ may be higher than the threshold voltage for a zero gate voltage $V_G$, and the threshold voltage for a negative gate voltage $V_G$ may be lower than the threshold voltage for a zero gate voltage $V_G$. Therefore, a desired I-V curve of the graphene thin film diode 300 may be obtained by adjusting the gate voltage $V_G$ applied to the gate electrode 330.

The graphene thin film diode 300 according to example embodiments may have an output characteristic that varies depending on the gate voltage $V_G$ thereof, and may be used as a switching device.

A method of manufacturing a graphene thin film diode shown in FIG. 6 according to example embodiments is described in detail with reference to FIGS. 8 to 12.

FIGS. 8 to 12 are schematic sectional views illustrating a method of manufacturing a graphene thin film diode shown in FIG. 6 according to example embodiments.

Figure 8:
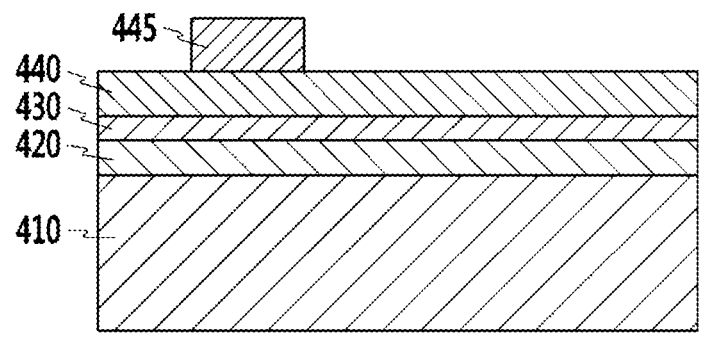
FIGS. 8 to 12 are schematic sectional views illustrating a method of manufacturing a graphene thin film diode shown in FIG. 6 according to example embodiments.

Referring to FIG. 8, a triple-layered member including a sacrificial substrate 410, a sacrificial layer 420, and a semiconductor layer 430 may be formed. A method of forming the triple-layered member including the sacrificial substrate 410, the sacrificial layer 420, and the semiconductor layer 430 may be similar to a method described above with reference to FIG. 1 and thus the detailed description thereof is omitted.

A conductor layer 440 is deposited on the semiconductor layer 430 by, for example, sputtering to form a multiple-layered member, and a photoresist 445 may be formed on the conductor layer 440. The conductor layer 440 may correspond to the optional layer 140 shown in FIG. 1.

The conductor layer 440, the semiconductor layer 430, and the sacrificial layer 420 may be etched in sequence by using the photoresist 445 as an etching mask.

Figure 9:
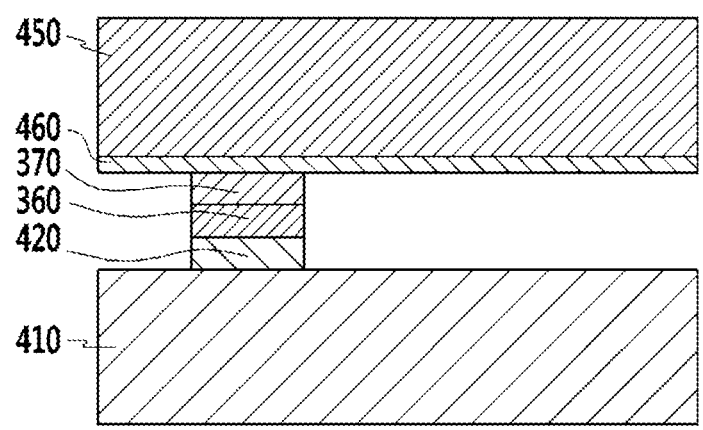

Referring to FIG. 9, portions of the conductor layer 440 and the semiconductor layer 430, which are left against (or, after) the etching, may become a first electrode 370 and a semiconductor member 360, respectively.

Subsequently, a transfer substrate 450 may be stuck on the first electrode 370 with an adhesive layer 460. A method of sticking the transfer substrate 450 on the first electrode 370 may be similar to the method described above with reference to FIG. 2.

Thereafter, the sacrificial layer 420 may be removed by a wet etch to remove the sacrificial substrate 410 and to expose a bottom surface of the semiconductor member 360.

Figure 10:
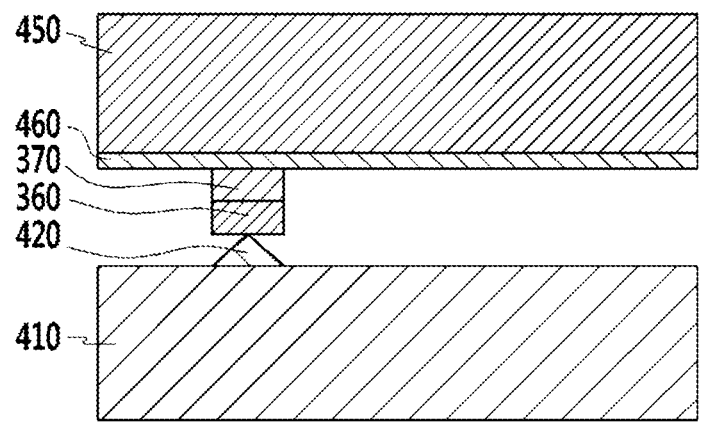

FIG. 10 shows that most portions of the sacrificial layer 420 are removed by an etchant invading sides of the sacrificial layer 420.

Figure 11:
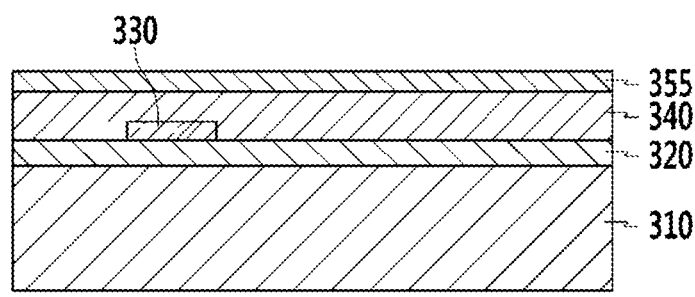

Referring to FIG. 11, a subsidiary insulating layer 320 and a conductor layer (not shown) may be deposited in sequence on a base substrate 310. The subsidiary insulating layer 320 may include an oxide or a nitride of a semiconductor, and may be formed by oxidizing or nitriding a surface of the base substrate 310 or by depositing the oxide or the nitride on the base substrate 310 using a CVD process. The conductor layer may be formed by depositing a conductive material, (e.g., a metal) using sputtering, for example.

The conductor layer may be patterned to form a gate electrode 330, and a gate insulating layer 340 may be deposited thereon by CVD, for example. Thereafter, a graphene layer 355 may be deposited on the gate insulating layer 340. The deposition of the graphene layer 355 may be conducted by a process similar to that described above with reference to FIG. 4.

Figure 12:
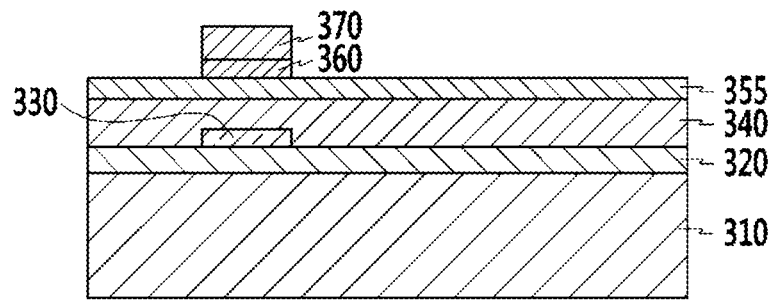

Referring to FIG. 12, a laminate including the layers 360, 370, 460 and 450 shown in FIG. 10 and another laminate including the layers 310, 320, 330, 340, 350 shown in FIG. 11 may be attached to each other such that the exposed surface of the semiconductor member 360 in the process shown in FIG. 10 contacts a surface of the graphene layer 355. In example embodiments, the gate electrode 330 may be aligned with the semiconductor member 360.

Subsequently, the adhesive layer 460 may be removed to take out the transfer substrate 450.

Referring to FIG. 8, another conductor layer (not shown) may be deposited and patterned to form a second electrode 380.

The graphene layer 355 may be patterned to form a graphene member 350. Alternatively, the patterning of the graphene layer 355 may be conducted in another step. For example, the formation of the graphene member 350 by the patterning of the graphene layer 355 may be performed before attaching the semiconductor member 360, or before forming the second electrode 380 after attaching the semiconductor member 360.

According to example embodiments, the graphene thin film diode 300 including the joint of the semiconductor member 360 and the graphene member 350 may be manufactured in ease by using a transfer method.

The graphene thin film diode 300 shown in FIG. 6 may be applied to a display device (e.g., an organic light emitting display (OLED)) or a resistive random access memory (RRAM), which is described in detail with reference to FIGS. 13 to 15.

Figure 13:
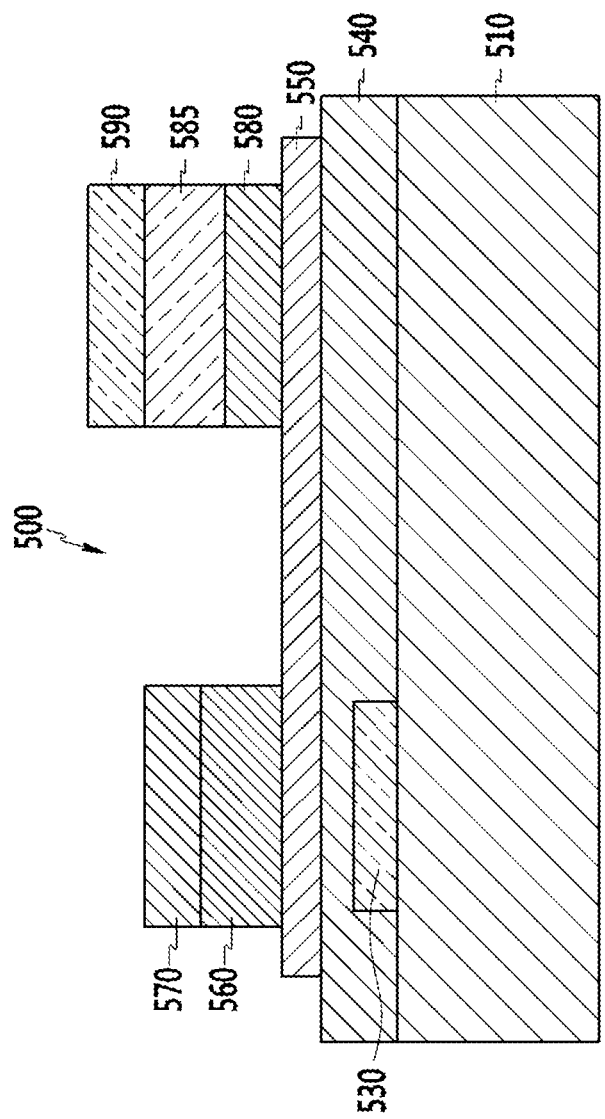
FIG. 13 is a schematic diagram of a structure that forms at least a portion of a pixel in an OLED according to example embodiments.
Figure 14:
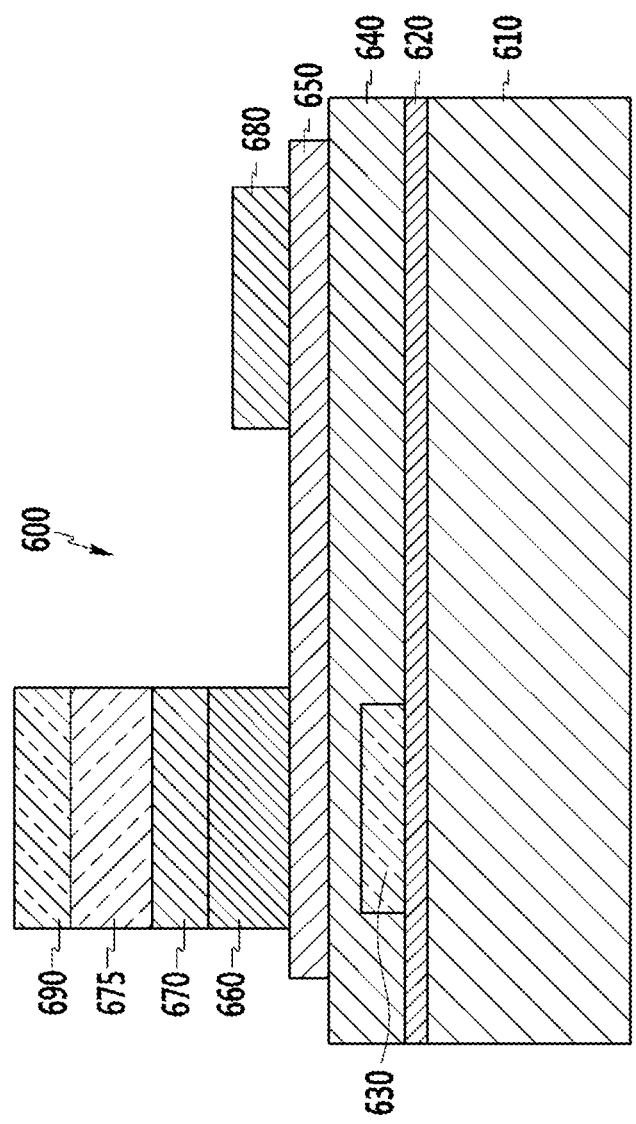
FIG. 14 is a schematic diagram of another structure that forms at least a portion of a pixel in an OLED according to example embodiments.
Figure 15:
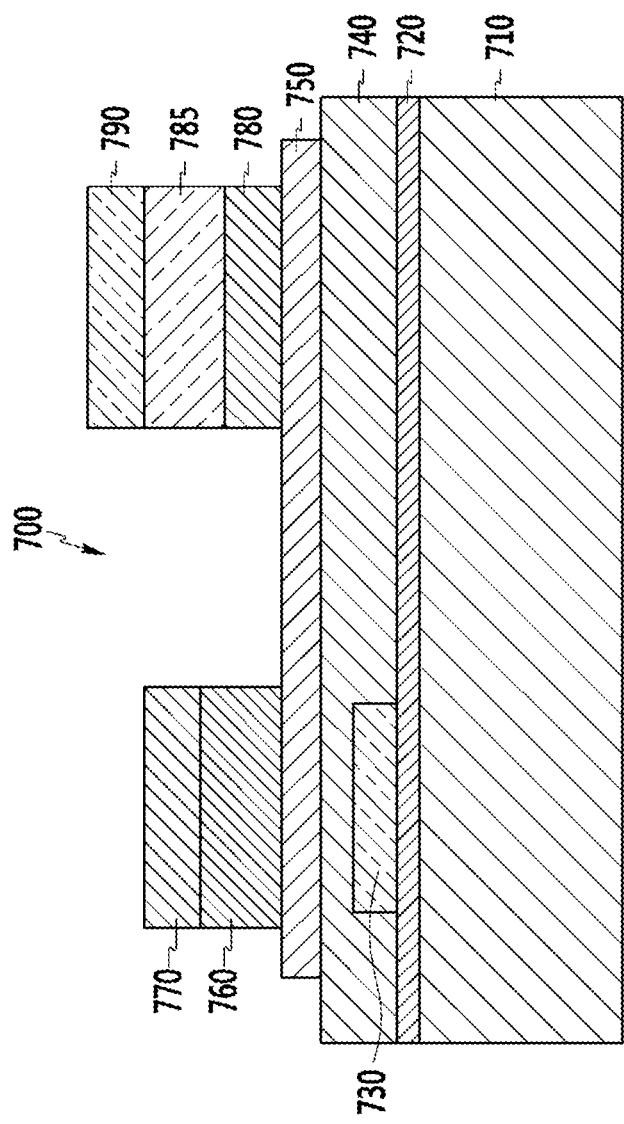
FIG. 15 is a schematic diagram of a structure that forms at least a portion of a cell in an RRAM according to example embodiments.

FIG. 13 is a schematic diagram of a structure that forms at least a portion of a pixel in an OLED according to example embodiments, FIG. 14 is a schematic diagram of another structure that forms at least a portion of a pixel in an OLED according to example embodiments, and FIG. 15 is a schematic diagram of a structure that forms at least a portion of a cell in an RRAM according to example embodiments.

Referring to FIG. 13, a pixel 500 of an OLED according to example embodiments may include a substrate 510, a gate electrode 530, a gate insulating layer 540, a graphene member 550, a semiconductor member 560, a first electrode 570, a second electrode 580, a light emitting layer 585, and a third electrode 590.

The substrate 510, the gate electrode 530, the gate insulating layer 540, the graphene member 550, the semiconductor member 560, the first electrode 570, and the second electrode 580 may form a switching diode, and the second electrode 580, the light emitting layer 585, and the third electrode 590 may form an organic light emitting diode. The light emitting layer 585 may include an organic light emitting layer that generates light under current flow.

According to example embodiments, the semiconductor member 560 may be N-type. Therefore, the first electrode 570 may serve as an anode of the switching diode, while the second electrode 580 may serve as a cathode of the switching diode. In addition, the light emitting layer 585 and the third electrode 590 thereon may be disposed on the second electrode 580, the cathode of the switching diode. Therefore, the second electrode 580 may play a role of an anode of the organic light emitting diode, while the third electrode 590 may play a role of a cathode of the organic light emitting diode.

At least one of the second electrode 580 and the third electrode 590 may be translucent or transparent so that light from the light emitting layer 585 may pass therethrough.

According to example embodiment embodiments, the switching diode may have a structure similar to the graphene thin film diode 300 shown in FIG. 6. However, the substrate 510 may be a transparent insulator including glass, for example, and thus the pixel 500 does not include the subsidiary insulating layer 320 shown in FIG. 6. According to example embodiment embodiments, the substrate 510 may be a semiconductor substrate like FIG. 6, and a subsidiary insulating layer (not shown) may be disposed between the substrate 510 and the gate electrode 530.

When manufacturing the OLED shown in FIG. 13, a graphene thin film diode may be formed by a method, for example, as described above with reference to FIGS. 8 to 12. Thereafter, the light emitting layer 585 may be formed on the second electrode 580 and the third electrode 590 may be formed thereon.

FIG. 14 is a schematic diagram of another structure that forms at least a portion of a pixel in an OLED according to example embodiments.

Referring to FIG. 14, another pixel 600 of an OLED according to example embodiments may include a substrate 610, a subsidiary insulating layer 620, a gate electrode 630, a gate insulating layer 640, a graphene member 650, a semiconductor member 660, a first electrode 670, a second electrode 680, a light emitting layer 675, and a third electrode 690.

The substrate 610, the gate electrode 630, the gate insulating layer 640, the graphene member 650, the semiconductor member 660, the first electrode 670, and the second electrode 680 may form a switching diode like FIG. 13.

However, unlike FIG. 13, the semiconductor member 660 may be P-type, and the first electrode 670 may serve as an cathode of the switching diode, while the second electrode 680 may serve as a anode of the switching diode. Therefore, the light emitting layer 675 and the third electrode 690 thereon may be disposed on the first electrode 670, the cathode of the switching diode. The first electrode 670, the light emitting layer 675, and the third electrode 690 may form an organic light emitting diode. At least one of the first electrode 670 and the third electrode 690 may be translucent or transparent so that light from the light emitting layer 675 may pass therethrough.

According to example embodiments, the substrate 610 may include a semiconductor (e.g., silicon (Si), GaAs, InP, GaP, or InAs), and thus the subsidiary insulating layer 620 may be added between the substrate 610 and the gate electrode 630 like FIG. 6. However, according to example embodiments, the substrate 610 may be an insulator like FIG. 13, and the subsidiary insulating layer 620 may be omitted.

When manufacturing the OLED shown in FIG. 14, a graphene thin film diode may be formed by a method, for example, as described above with reference to FIGS. 8 to 12. Thereafter, the light emitting layer 675 may be formed on the first electrode 670 and the third electrode 690 may be formed thereon.

FIG. 15 is a schematic diagram of a structure that forms at least a portion of a cell in an RRAM according to example embodiments.

Referring to FIG. 15, a cell 700 of an RRAM according to example embodiments may include a substrate 710, a subsidiary insulating layer 720, a gate electrode 730, a gate insulating layer 740, a graphene member 750, a semiconductor member 760, a first electrode 770, a second electrode 780, a resistive material layer 785, and a third electrode 790.

The substrate 710, the gate electrode 530, the subsidiary insulating layer 720, the gate insulating layer 740, the graphene member 750, the semiconductor member 760, the first electrode 770, and the second electrode 780 may form a switching diode, and the resistive material layer 785 is disposed between the second electrode 780 and the third electrode 790.

The resistive material layer 785 may serve as an insulator when a voltage is across opposite ends thereof, that is, a voltage difference between the second electrode 780 and the third electrode 790. However, the resistance of the resistive material layer 785 may be lower and a current may passes through the resistive material layer 785 when the voltage across opposite ends of the resistive material layer 785 is raised above a set level. Examples of materials for the resistive material layer 785 may include a phase change chalcogenide (e.g., $Ge_2Sb_2Te_5$ or AgInSbT), a binary transition metal oxide (e.g., NiO or $TiO_2$), a perovskite (e.g., Sr(Zr)$TiO_3$), a solid-state electrolyte (e.g., GeS, GeSe, or $Cu_2S$), and an organic charge transfer complex (e.g., copper tetracyanoquinodimethane (CuTCNQ)).

According to example embodiments, the semiconductor member 760 may be N-type like FIG. 3. Therefore, the first electrode 770 may serve as an anode of the switching diode, while the second electrode 780 may serve as a cathode of the switching diode. In addition, the resistive material layer 785 and the third electrode 790 thereon may be disposed on the second electrode 780, the cathode of the switching diode.

According to example embodiments, the substrate 710 may include a semiconductor (e.g., silicon (Si), GaAs, InP, GaP, or InAs), like FIG. 14. Therefore, the subsidiary insulating layer 720 may be added between the substrate 710 and the gate electrode 730.

When manufacturing the RRMA shown in FIG. 15, a graphene thin film diode may be formed by a method, for example, as described above with reference to FIGS. 8 to 12. Thereafter, the resistive material layer 785 may be formed on the second electrode 780 and the third electrode 790 may be formed thereon. When the resistive material layer 785 is disposed on the first electrode 770, the resistive material layer 785 may be formed on the first electrode 770 and the third electrode 790 may be formed thereon.

A pixel of an OLED including the structure shown in FIG. 13 or FIG. 14 is described in detail with reference to FIGS. 16 to 19.

Figure 16:
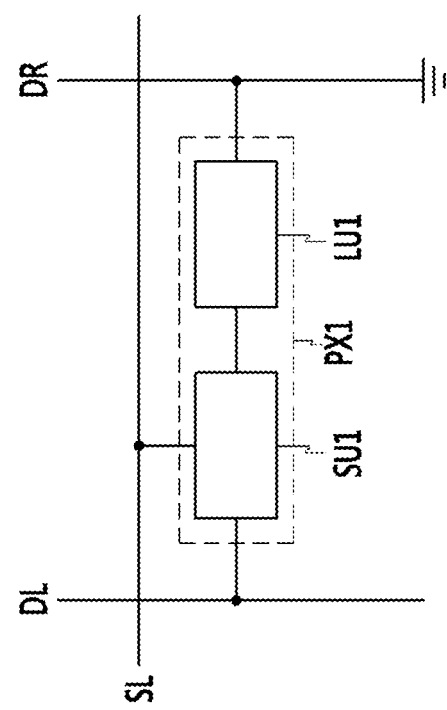
FIG. 16 is a block diagram of a pixel of an OLED according to example embodiments.
Figure 17:
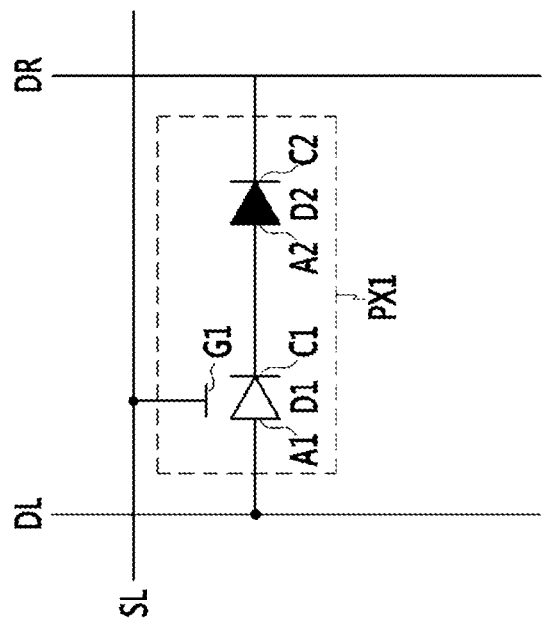
FIG. 17 is an example equivalent circuit diagram of the pixel shown in FIG. 16.

FIG. 16 is a block diagram of a pixel of an OLED according to example embodiments, and FIG. 17 is an example equivalent circuit diagram of the pixel shown in FIG. 16.

Referring to FIG. 16, an OLED according to example embodiments may include a pixel PX1, a scanning line SL, a data line DL, and a drain line DR. The pixel PX1 may include a switching unit SU1 connected to the scanning line SL and the data line DL, and a light emitting unit LU1 connected to the switching unit SU1 and the drain line DR.

FIG. 17 shows a switching diode D1 as an example of the switching unit SU1, and an organic light emitting diode D2 as an example of the light emitting unit LU1. The switching diode D1 and the organic light emitting diode D2 may have a structure as shown in FIG. 13 or FIG. 14, and the switching diode D1 may be a graphene thin film diode.

In FIG. 17, the switching diode D1 may have a gate electrode G1 connected to the scanning line SL, an anode A1 connected to the data line DL, and a cathode C1 connected to the organic light emitting diode D2. The organic light emitting diode D2 may have an anode A2 connected to the cathode C1 of the switching diode D1, and a cathode C2 connected to the drain line DR that is connected to ground.

In this OLED, the switching diode D1 may turn on based on a scanning signal transmitted by the scanning line SL and may transmit an image signal from the data line DL to the organic light emitting diode D2. The organic light emitting diode D2 may convert the image signal into light to be emitted. The image signal inputted into the organic light emitting diode D2 may be a current signal.

Figure 18:
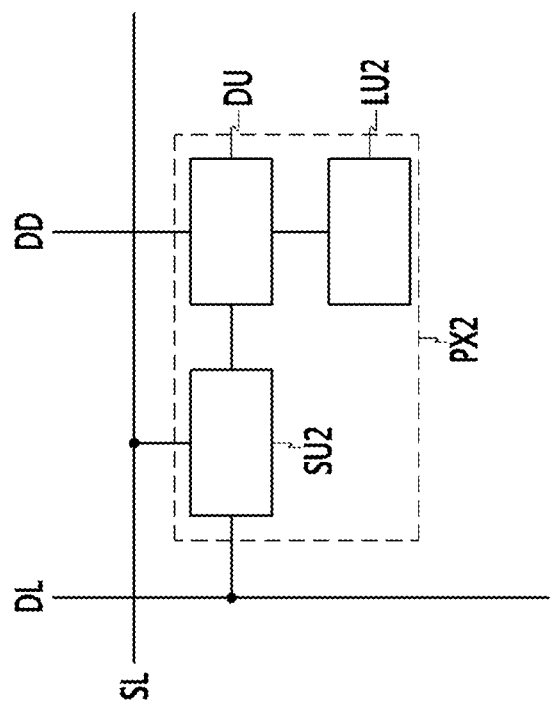
FIG. 18 is a block diagram of another pixel of an OLED according to example embodiments.
Figure 19:
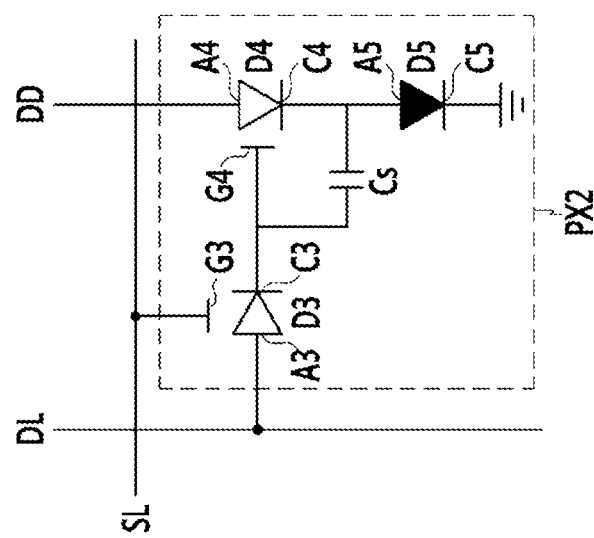
FIG. 19 is an example equivalent circuit diagram of the pixel shown in FIG. 18.

FIG. 18 is a block diagram of another pixel of an OLED according to example embodiments, and FIG. 19 is an example equivalent circuit diagram of the pixel shown in FIG. 18.

Referring to FIG. 18, an OLED according to example embodiments may include a pixel PX2, a scanning line SL, a data line DL, and a supply voltage line DD. The pixel PX2 may include a switching unit SU2 connected to the scanning line SL and the data line DL, a driving unit DU connected to the switching unit SU2 and the supply voltage line DD, and a light emitting unit LU2 connected to the driving unit DU.

FIG. 19 shows a switching diode D3 as an example of the switching unit SU2, a driving diode D4 and a storage capacitor Cs as an example of the driving unit DU, and an organic light emitting diode D5 is an example of the light emitting unit LU2. Each of the switching diode D3 and the organic light emitting diode D4 may be a graphene thin film diode, and may have a structure shown in FIG. 6, or a structure of the switching diode as shown in FIG. 13 or FIG. 14.

In FIG. 19, the switching diode D3 may have a gate electrode G3 connected to the scanning line SL, an anode A3 connected to the data line DL, and a cathode C1 connected to the driving diode D4. The driving diode D4 may have a gate electrode G4 connected to the cathode C3 of the switching diode D3, an anode A4 connected to the supply voltage line DD, and a cathode C4 connected to the organic light emitting diode D5. The organic light emitting diode D5 may have an anode A5 connected to a cathode C4 of the driving diode D4, and a cathode C5 connected to a ground. The storage capacitor Cs may be connected between the gate electrode D4 and the anode A4 of the driving diode D4.

In this OLED, the switching diode D3 may turn on based on a scanning signal transmitted by the scanning line SL, and may transmit an image signal from the data line DL to the driving unit DU (i.e., to the driving diode D4 and the storage capacitor Cs). The driving diode D4 may provide the organic light emitting diode D5 with a current having a magnitude corresponding to the image signal, and the organic light emitting diode D5 may emit light having an intensity depending on the magnitude of the current. The image signal may be a voltage signal, and the storage capacitor Cs may sustain the voltage of the image signal even when the switching diode D3 turns off.

A cell of a RRAM including the structure shown in FIG. 15 is described in detail with reference to FIGS. 20 and 21.

Figure 20:
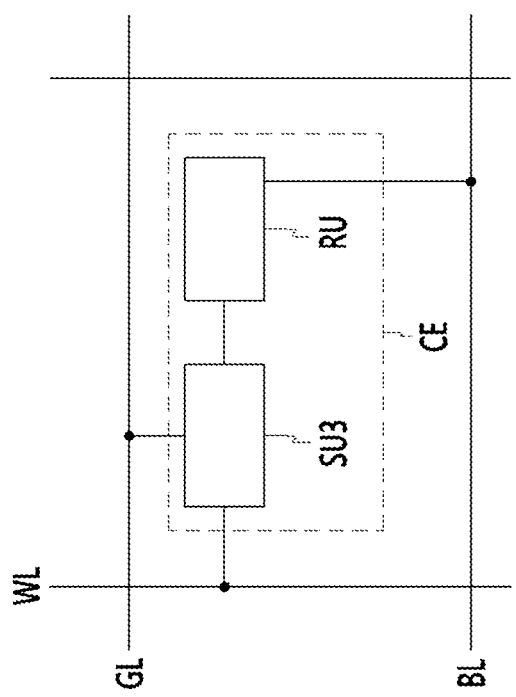
FIG. 20 is a block diagram of a cell of a RRAM according to example embodiments.
Figure 21:
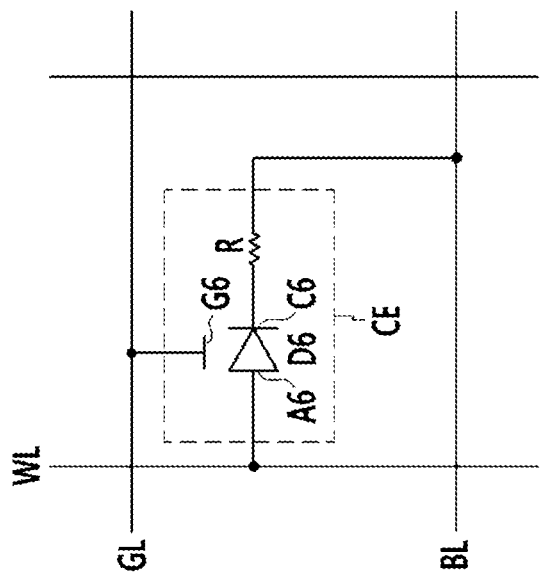
FIG. 21 is an example equivalent circuit diagram of the cell shown in FIG. 20.

FIG. 20 is a block diagram of a cell of a RRAM according to example embodiments, and FIG. 21 is an example equivalent circuit diagram of the cell shown in FIG. 20.

Referring to FIG. 20, a RRAM according to example embodiments may include a cell CE, a word line WL, a bit line BL, and a gate line GL. The cell CE may include a switching unit SU3 connected to the word line WL and the gate line GL, and a resistive unit RU connected to the switching unit SU3 and the bit line BL.

FIG. 21 shows a switching diode D6 as an example of the switching unit SU3, and a resistor R as an example of the resistive unit RU. The switching diode D6 may be a graphene thin film diode, and the resistor R may have two states (a high resistance state and a low resistance state). The switching diode D6 and the resistor R may have a structure as shown in FIG. 15, and the resistor R may be represent a resistance of the resistive material layer 785.

In FIG. 21, the switching diode D6 may have a gate electrode G6 connected to the gate line GL, an anode A6 connected to the word line WL, and a cathode C6 connected to the resistor R. The resistor R may be connected between the cathode C6 of the switching diode D6 and the bit line BL.

Each of the switching units SU1, SU2 and SU3 shown in FIGS. 16, 18, and 20 may include two or more switching elements, and the switching elements may include the graphene thin film diode described above with reference to FIG. 6.

An OLED according to example embodiments is described in detail with reference to FIGS. 22 and 23 as well as FIGS. 13 and 14.

Figure 22:
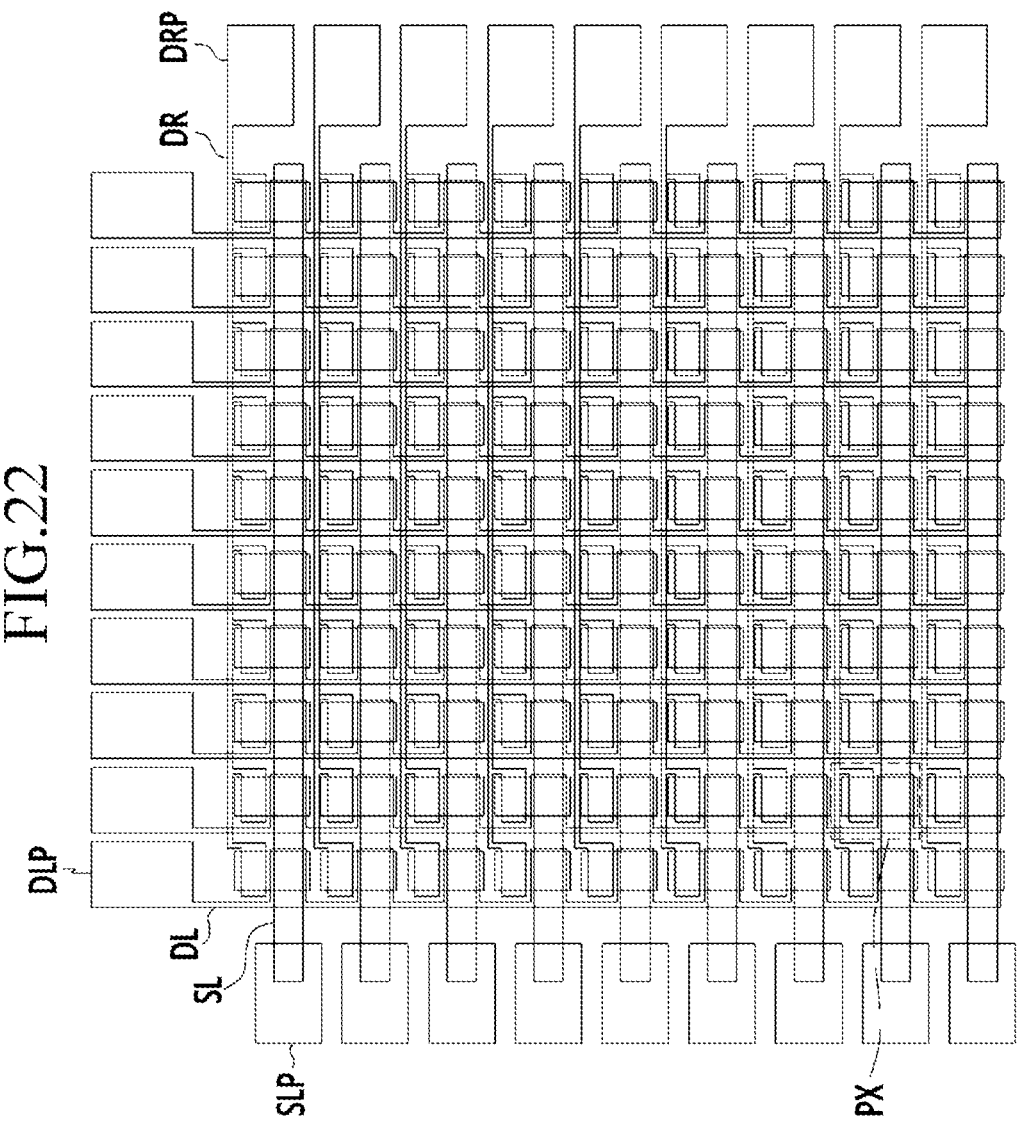
FIG. 22 is a schematic layout view of an OLED according to example embodiments.
Figure 23:
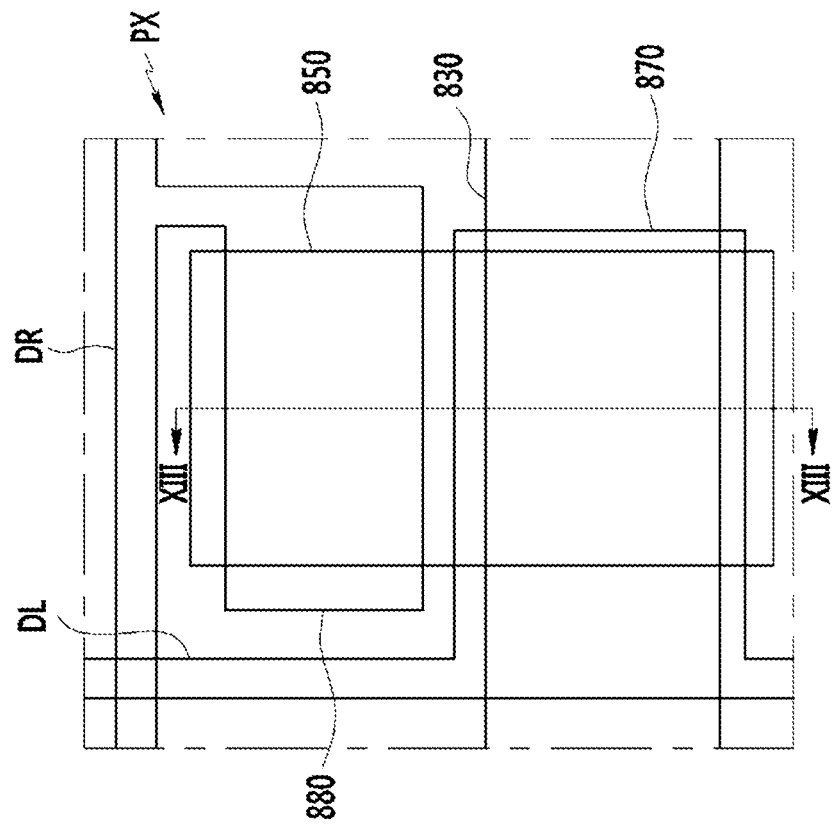
FIG. 23 is a schematically expanded layout view of a pixel of the OLED shown in FIG. 22.

FIG. 22 is a schematic layout view of an OLED according to example embodiments, and FIG. 23 is a schematically expanded layout view of a pixel of the OLED shown in FIG. 22.

Referring to FIG. 22, an OLED according to example embodiments may include a plurality of pixels PX, a plurality of scanning lines SL and scanning line pads SLP, a plurality of data lines DL and data line pads DLP, and a plurality of drain lines DR and drain line pads DRP.

Referring to FIGS. 22 and 23, each pixel PX may include a gate electrode 830, a graphene member 850, a first electrode 870, and a second electrode 880. Each pixel PX may further include a semiconductor member (not shown), a light emitting layer (not shown), and a third electrode (not shown).

A cross section of the pixel PX may have a structure similar to the structure as shown in FIG. 13 or FIG. 14, which may correspond to a cross section of the pixel PX shown in FIG. 23 taken along line XIII-XIII.

Referring to FIGS. 22, 23, 13, and 14, a plurality of scanning lines SL extending in a transverse direction may be disposed on a substrate 510 or 610. The substrate 510 or 610 may be an insulator substrate or a semiconductor substrate. When the substrate 610 is a semiconductor substrate as shown in FIG. 14, a subsidiary insulating layer 620 may be disposed between the substrate 610 and the scanning lines SL. The scanning lines SL may include a conductive material (e.g., a metal), and gate electrodes 530, 630 or 830 may be portions of the scanning lines SL.

A gate insulating layer 540 or 640 may be disposed on the scanning lines SL and the substrate 510 or 610. The gate insulating layer 540 or 640 may include an oxide or a nitride of a semiconductor (e.g., $SiO_2$ and $SiN_x$).

A plurality of graphene members 550, 650 or 850 may be disposed on the gate insulating layer 540 or 640. The graphene members 550, 650 or 850 may include multilayer graphene, or single-layer graphene.

A plurality of semiconductor members 560 or 660 may be disposed on the graphene members 550, 650 or 850 and the gate insulating layer 540 or 640, and a plurality of data lines DL, a plurality of data line pads DLP, and a plurality of first electrodes 570, 670 or 870 may be disposed on the semiconductor members 560 or 660. The semiconductor members 560 or 660 may be N-type or P-type.

The data lines DL may extend in a longitudinal direction and cross the scanning line SL, and the data line pads DLP may be located near one end of the data lines DL. The first electrodes 570, 670 or 870 may be disposed on the gate electrodes 530, 630 or 830. The data line pads DLP and the first electrodes 570, 670 or 870 may be connected to the data line DL, and may be formed from a layer from which the data lines DL are formed. In view of FIG. 23, edges of the semiconductor members 560 or 660 may coincide with edges of the data lines DL, the data line pads DLP, and the first electrodes 570, 670 or 870.

A plurality of second electrodes 580, 680 or 880 may be disposed on respective graphene members 550, 650 or 850, and the second electrodes 580, 680 or 880 may be spaced apart from the semiconductor members 560 or 660, the data lines DL, the data line pads DLP, and the first electrodes 570, 670 or 870.

A plurality of light emitting layers 585 or 675 may be disposed on the second electrodes 580 and 880, or on the first electrodes 670 or 870. When the semiconductor members 560 are N-type as shown in FIG. 13, the light emitting layers 585 may be disposed on the second electrodes 580 and 880. However, when the semiconductor members 660 are P-type as shown in FIG. 14, the light emitting layers 675 may be disposed on the first electrodes 670 or 870.

Another insulating layer (not shown) may be disposed on the data lines DL.

A plurality of drain lines DR, a plurality of drain line pads DRP, and a plurality of third electrodes 590 or 690 may be disposed on the gate insulating layer 540 or 640 and the light emitting layers 585 or 675.

The drain lines DR may be disposed on the gate insulating layer 540 or 640, and may extend in the longitudinal direction to cross the data lines DL. The drain lines DR and the scanning line SL may be arranged in an alternate manner. The drain line pads DRP may be located at one end of the drain lines DR, the third electrodes 590 or 690 are disposed on the light emitting layers 585 or 675. The drain line pads DRP and the third electrodes 590 or 690 may be connected to the drain lines DR, and may be formed from a layer from which the drain lines DR are formed.

The gate insulating layer 540 or 640 may have contact holes exposing one end portion of the scanning lines SL. The scanning line pads SLP may be disposed on the gate insulating layer 540 or 640, and may be connected to the scanning lines SL through the contact holes. The OLED shown in FIGS. 22 and 23 may be represented by an equivalent circuit shown in FIG. 17.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:
1. A method of manufacturing a graphene semiconductor device, the method comprising:
    forming a multilayered member including a sacrificial substrate, a sacrificial layer, and a semiconductor layer deposited in sequence;
    forming a transfer substrate on the semiconductor layer;

forming a first laminate including the transfer substrate and the semiconductor layer by removing the sacrificial layer to separate the sacrificial substrate from the semiconductor layer;
forming a second laminate by forming a graphene layer on a base substrate;
combining the first laminate and the second laminate such that the semiconductor layer contacts the graphene layer; and
removing the transfer substrate.

2. The method of claim 1, wherein the semiconductor layer includes at least one of Si, GaAs, InP, GaP, and InAs.

3. The method of claim 1, wherein the sacrificial layer includes at least one of $SiO_2$, SiN, $Al_2O_3$, $HfO_2$, $ZrO_2$, AlGaAs, and AlAs.

4. The method of claim 1, wherein forming the multilayered member includes,
depositing a conductor layer on the semiconductor layer;
patterning the conductor layer to form a first electrode; and
patterning the semiconductor layer to form a semiconductor member.

5. The method of claim 4, wherein combining the first laminate and the second laminate includes contacting the semiconductor member with the graphene layer, and
wherein the method further comprises forming a second electrode on an exposed surface of the graphene layer.

6. The method of claim 5, wherein forming the second laminate includes,
forming a gate electrode on the base substrate;
forming a gate insulating layer on the gate electrode and the base substrate; and
forming the graphene layer on the gate insulating layer, and
wherein combining the first laminate and the second laminate includes aligning the gate electrode with the semiconductor member.

7. The method of claim 6, further comprising:
forming a light emitting layer; and
forming a third electrode on the light emitting layer,
wherein the light emitting layer is on the second electrode when the semiconductor layer includes an N-type semiconductor, and the light emitting layer is on the first electrode when the semiconductor layer includes a P-type semiconductor.

8. The method of claim 6, further comprising:
forming a resistive material layer and a third electrode on one of the first electrode and the second electrode,
wherein the resistive material layer has a resistance that varies based on a voltage across ends of the resistive material layer.

9. The method of claim 6, wherein the base substrate includes an insulator, and
the gate electrode contacts the base substrate.

10. The method of claim 6, wherein the base substrate includes a semiconductor, and
forming the second laminate further includes forming a subsidiary insulating layer between the base substrate and the gate electrode.

11. A graphene semiconductor device, comprising:
a gate electrode on a substrate;
a gate insulating layer on the gate electrode;
a graphene member on the gate insulating layer;
a semiconductor member joined with the graphene member;
a first electrode on the semiconductor member;
a second electrode on the graphene member;
a light emitting layer on one of the first electrode and the second electrode; and
a third electrode on the light emitting layer,
wherein
the second electrode is spaced apart from the semiconductor member and the first electrode,
the light emitting layer is on the second electrode when the semiconductor layer includes an N-type semiconductor, and
the light emitting layer is on the first electrode when the semiconductor layer includes a P-type semiconductor.

12. The device of claim 11, wherein the semiconductor layer includes at least one of Si, GaAs, InP, GaP, and InAs.

13. A graphene semiconductor device, comprising:
a gate electrode on a substrate;
a gate insulating layer on the gate electrode;
a graphene member on the gate insulating layer;
a semiconductor member joined with the graphene member;
a first electrode on the semiconductor member;
a second electrode on the graphene member;
a resistive material layer on one of the first electrode and the second electrode; and
a third electrode on the resistive material layer,
wherein
the second electrode is spaced apart from the semiconductor member and the first electrode, and
the resistive material layer has a resistance that varies based on a voltage across ends of the resistive material layer.

14. The device of claim 11, wherein the substrate includes an insulator, and
the gate electrode contacts the substrate.

15. The device of claim 11, further comprising a subsidiary insulating layer between the base substrate and the gate electrode,
wherein the substrate includes a semiconductor.

16. The device of claim 11, wherein at least one of the first electrode and the second electrode is transparent or translucent.

17. An organic light emitting display, comprising:
a switching unit including a graphene semiconductor device, wherein the switching unit has a first terminal, a second terminal, and a third terminal;
a scanning line connected to the first terminal of the switching unit;
a data line connected to the second terminal of the switching unit; and
a light emitting unit connected to the third terminal of the switching unit,
wherein the graphene semiconductor device includes,
a gate electrode on a substrate,
a gate insulating layer on the gate electrode,
a graphene member on the gate insulating layer,
a semiconductor member joined with the graphene member,
a first electrode on the semiconductor member, and
a second electrode on the graphene member, wherein the second electrode is spaced apart from the semiconductor member and the first electrode.

18. An organic light emitting display, comprising:
a switching unit including a graphene semiconductor device, wherein the switching unit includes a first terminal, a second terminal, and a third terminal;
a scanning line connected to the first terminal of the switching unit;
a data line connected to the second terminal of the switching unit;

a driving unit having a first terminal and a second terminal, wherein the first terminal of the driving unit is connected to the third terminal of the switching unit; and a light emitting unit connected to the second terminal of the driving unit, wherein the graphene semiconductor device includes, a gate electrode on a substrate, a gate insulating layer on the gate electrode, a graphene member on the gate insulating layer, a semiconductor member joined with the graphene member, a first electrode on the semiconductor member, and a second electrode on the graphene member, wherein the second electrode is spaced apart from the semiconductor member and the first electrode.

19. A memory, comprising:

a switching unit including a graphene semiconductor device, wherein the switching unit includes a first terminal, a second terminal, and a third terminal;

a word line connected to the first terminal of the switching unit;

a gate line connected to the second terminal of the switching unit;

a resistive unit having a first terminal and a second terminal, wherein the first terminal of the resistive unit is connected to the third terminal of the switching unit; and a bit line connected to the second terminal of the resistive unit, wherein the graphene semiconductor device includes, a gate electrode on a substrate, a gate insulating layer on the gate electrode, a graphene member on the gate insulating layer, a semiconductor member joined with the graphene member, a first electrode on the semiconductor member, and a second electrode on the graphene member, wherein the second electrode is spaced apart from the semiconductor member and the first electrode.

20. The device of claim 13, further comprising:

a subsidiary insulating layer between the base substrate and the gate electrode, wherein the base substrate includes a semiconductor.

* * * * *